United States Patent [19]

Johnson

[11] 4,284,839
[45] Aug. 18, 1981

[54] INTERNAL REFRACTOR FOCUSING SOLAR ENERGY COLLECTOR APPARATUS AND METHOD

[76] Inventor: Steven A. Johnson, 136 N. 1st West, Preston, Id. 83263

[21] Appl. No.: 970,673

[22] Filed: Dec. 18, 1978

[51] Int. Cl.³ .......................... H01L 31/04; F24J 3/02
[52] U.S. Cl. .................... 136/246; 126/424; 126/438; 126/440
[58] Field of Search ............. 126/424, 438, 440, 439, 126/441, 452, 425; 350/211; 136/246

[56] References Cited

U.S. PATENT DOCUMENTS

| | | | |
|---|---|---|---|
| 1,345,758 | 7/1920 | Folsom | 126/424 |
| 3,052,229 | 9/1962 | Wenger | 126/424 |
| 3,915,147 | 10/1975 | Rineer | 126/446 X |
| 3,981,295 | 9/1976 | Minnick | 126/440 |
| 3,998,206 | 12/1976 | Jahn | 126/425 X |
| 4,011,858 | 2/1977 | Harkett | 126/424 |
| 4,027,653 | 6/1977 | Meckler | 126/438 X |
| 4,068,474 | 1/1978 | Dimitroff | 126/440 X |
| 4,069,812 | 1/1978 | O'Neill | 126/440 X |
| 4,077,392 | 3/1978 | Garner | 126/424 |
| 4,098,264 | 7/1978 | Brokaw | 126/438 X |
| 4,106,480 | 8/1978 | Lyon et al. | 126/438 X |
| 4,106,485 | 8/1978 | Polley | 126/439 X |
| 4,108,154 | 8/1978 | Nelson | 126/425 |
| 4,108,540 | 8/1978 | Anderson et al. | 350/211 |
| 4,109,638 | 8/1978 | Matlock et al. | 126/425 |
| 4,116,221 | 9/1978 | Zaugg et al. | 126/424 |
| 4,129,119 | 12/1978 | Yoke | 126/424 |
| 4,139,286 | 2/1979 | Hein et al. | 126/440 X |
| 4,149,523 | 4/1979 | Boy-Marcotte et al. | 126/438 X |

FOREIGN PATENT DOCUMENTS 639277  3/1928  France .................................. 350/211

Primary Examiner—Allan N. Shoap
Attorney, Agent, or Firm—J. Winslow Young; H. Ross Workman; Rick D. Nydegger

[57] ABSTRACT

A solar energy collector apparatus and method, the apparatus including an open-top shell-like structure. A Fresnel lens system and a mirror system inside the shell structure focus and direct solar energy toward a solar energy absorber apparatus also inside the shell structure. The shell structure is mounted upon a hollow axle in a framework for rotation about its longitudinal axis. The framework supports the longitudinal axis in a position generally parallel to the axis of rotation of the earth to provide an equatorial mounting for the solar energy collector. Rotation about the longitudinal axis adapts the solar collector for following the east-west movement of the sun. The optical apparatus in the shell structure is adapted for movement to follow the north-south seasonal changes in the sun's position. The solar energy absorber apparatus is nonrotatably supported inside the shell structure by the hollow axle and heat transfer conduits pass through the hollow axle to the solar energy absorber apparatus in nonrotable relationship therewith. A photovoltaic apparatus may be included within the shell structure for converting at least a portion of the incoming solar spectrum to electrical energy. This combination of features provides higher solar efficiencies and higher temperatures in the heat transfer fluid. The method includes tracking the sun with the solar energy collector apparatus thereby maximizing the amount of solar energy collected while eliminating coupling failures in the heat transfer conduits.

18 Claims, 5 Drawing Figures

INTERNAL REFRACTOR FOCUSING SOLAR ENERGY COLLECTOR APPARATUS AND METHOD

This application contains patentably distinct subject matter from co-pending applications, Ser. No. 970,761 and Ser. No. 970,762, both filed on even date herewith.

BACKGROUND

1. Field of the Invention

This invention relates to solar energy collector apparatus and, more particularly, to a solar energy collector apparatus and method whereby the shell structure for the solar collector is mounted on an equatorial mount for east-west tracking of the sun and the optical apparatus therein are movable so as to follow the seasonal variations of the sun without twisting or otherwise excessively bending the heat transfer conduits requiring flexible or rotatable couplings.

2. The Prior Art

Currently, the only inexhaustable source of energy available to mankind is solar energy. Solar energy or solar flux is customarily measured in langleys per minute, one langley being equivalent to one calorie of radiation energy per square centimeter. The intensity of the solar flux varies with geographical location, time of day, season, cloud cover, atmospheric dust, and the like, and this intensity varies between about zero and 1.5 calories per square centimeter per minute. Therefore, assuming a solar flux of one langley per minute, one square meter receives 10,000 calories per minute while a house roof, having 100 square meters, receives about 1,000,000 calories per minute. With an average of one langley per minute for 500 minutes per day (which is slightly more than 8 hours), the 100 square meter roof receives, in bright sunshine, about 500,000 kilocalories per day. This energy is the equivalent in thermal energy to burning about 14 gallons of gasoline. Therefore, solar energy represents a valuable, inexhaustable energy resource.

When an object such as a solar collector is exposed to solar radiation, its temperature rises until its heat losses become equal to its heat gains. The losses depend on the emission of radiation by the heated material, movement of the surrounding colder air, and thermal conductivity of the materials in contact with it. The gains depend upon the intensity of solar radiation and the absorptivity of solar radiation by its absorption surface. Customarily, solar energy is collected by two general techniques to produce higher temperatures: (1) by covering a receiving surface with a sunlight-transparent sheet of glass or plastic (flat plate collector), and (2) by focusing the solar radiation from a large area onto a receiver of small area (focusing collectors).

Flat plate collectors are usually stationary but should be repositioned every few days to follow the seasonal variations in the solar track. Flat plate collectors have the advantage of being generally cheaper to fabricate and also have the advantage in absorbing heat from diffuse solar radiation as well as the direct radiation by being able to operate on cloudy but bright days.

Focusing collectors can produce much higher temperatures although they can use direct radiation only and require turning throughout the day to follow the sun. Although focusing collectors are useful in obtaining higher temperatures from solar energy, (1) they usually cost more, (2) they need to be moved continuously to track the sun, and (3) they can use only direct solar radiation that is unscattered by clouds or haze. One common form of focusing collector is a parabolic mirror which has been used to obtain temperatures up to about 3500° C. depending upon the optical perfection of the parabolic surface. Unfortunately, parabolic collectors are relatively expensive, require sophisticated mountings and the absorption surface is usually interposed between the sun and the parabolic reflector at a position adjacent the focal point of the parabolic curvature.

Another device for useful focusing solar energy in a focusing collector is the Fresnel lens. The Fresnel lens consists of nested grooves cut or otherwise formed in one face of a transparent material such as plastic. The sides of each successive groove is set in such a way that the light passing through each groove is refracted at a slightly different angle so as to converge on a common focal point or line. Such lenses have been pressed from rigid sheets of plastic material and are, therefore, relatively inexpensive while being effective to give a relatively sharp focus. A more detailed discussion on the use of a Fresnel lens in a solar concentrator can be found in "Large-Scale Fresnel Lens Solar Concentrator" Marshall Space Flight Center, Alabama; *NASA Tech Briefs;* Winter (1977) p. 461.

Since focusing collectors require tracking mechanism for tracking the sun, various types of tracking devices have been developed. Tracking of the sun in its east-west movement only is relatively simple since the sun moves at a rate of 15° of arc every hour. This calculation is determined on the basis of the earth making one complete revolution of 360° in a 24 hour period so that in one hour it moves 360° divided by 24° or 15°. However, the annular motion of the earth relative to the sun causes the sun to appear to move in declination by about 47°. This wide range from summer solstice to winter solstice is a major problem any focusing collector system must face. Thus, any fully tracking collector that is focused continuously on the position of the sun in the sky requires motion in two coordinates. While the exact coordinates in which the motion is made are not deemed important, one set of coordinates may be rendered redundant by using an equatorial mounting where one axis of rotation is supported parallel to the axis of rotation of the earth. The sun then appears to have no significant daily motion in the transverse coordinate (declination). Meanwhile, any other set of axes of motion requires two motions to track the daily motion of the sun. However, in order to accommodate seasonal variations, it is necessary to include within the equatorial mounting a mechanism for matching daily changes in the seasonal position of the sun. Thus, an equatorial mounting presents the more feasible mounting system for a tracking or focusing solar collector.

Additional information regarding solar collectors can be found in Applied Solar Energy, Aden B. Meinel and Marjorie P. Meinel, Addison-Wesley Publishing Company, Reading, Mass. (1976) Library of Congress Catalog Card No. 75-40904, and Direct Use of the Sun's Energy, Farrington Daniels, Ballantine Books, New York (1977) Library of Congress Catalog Card No. 64-20913.

Utilization of collected solar energy very often occurs at a location other than the center of focus for a focusing collector. The exception to this statement are those focusing collectors which are used primarily as photovoltaic power towers, solar cookers, etc. The technique for transferring solar energy from its collection site to its utilization site generally involves some form of fluid heat transfer medium. The fluid heat transfer medium is conducted through conduits to and from the solar energy absorption site. The heat transfer medium is heated by the thermal energy produced by the absorbed solar energy and carries the thermal energy to the utilization site where the thermal energy is either utilized directly or stored for subsequent use. Unfortunately, the combination of movable solar collectors and fluid heat transfer conduits presents difficulties with regard to fabricating solar collectors which will accommodate flexure or otherwise movement of the fluid heat transfer conduits.

In view of the foregoing, it would be an advantage in the art to provide improvements in solar collector apparatus and the method for collecting solar energy. It would also be an advancement in the art to provide a solar collector apparatus for tracking the sun, the apparatus including mechanism for accommodating the movement of the solar collector and the optical apparatus therein while minimizing excessive flexure or twisting of the fluid heat transfer conduits. Such an invention is disclosed and claimed herein.

BRIEF SUMMARY AND OBJECTS OF THE INVENTION

The present invention relates to a novel apparatus and method for focusing and collecting solar energy for absorption as thermal energy by a fluid heat transfer medium. The solar energy collector apparatus is configurated to be a focusing collector and includes optical apparatus and structure to accommodate tracking the movement of the sun and to focus and direct the solar flux toward a solar energy absorber apparatus. Excessive flexure or twisting of the fluid heat transfer conduits or use of rotating couplings is minimized by mounting the solar energy absorber apparatus in a generally stationary position inside the movable shell structure. Photovoltaic apparatus may also be used for converting a portion of the solar flux into electrical energy.

It is, therefore, a primary object of this invention to provide improvements in solar energy collector apparatus.

Another object of this invention is to provide an improved method for collecting solar energy.

Another object of this invention is to provide a focusing solar collector apparatus which is relatively inexpensive to fabricate.

Another object of this invention is to provide a solar collector apparatus wherein the fluid heat transfer conduits are maintained in a relatively stationary position to minimize flexure of the conduits.

Another object of this invention is to provide a solar collector apparatus wherein the solar energy absorber mechanism is relatively stationary while the collector apparatus rotates thereabout.

These and other objects and features of the present invention will become more fully apparent from the following description and appended claims taken in conjunction with the accompanying drawing.

DETAILED DESCRIPTION OF THE PREFERRED EMBODIMENTS

The invention is best understood by reference to the drawings wherein like parts are designated with like numerals throughout.

Figure 1:
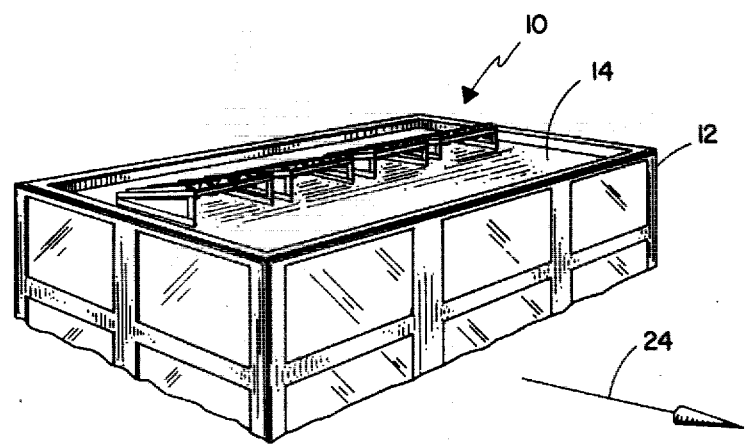
FIG. 1 is a perspective view of a solar collector apparatus in the environment of a building.

Referring now to FIG. 1, the solar collector apparatus of this invention is shown generally at 10 on the roof 14 of a building 12. It should be noted that the solar collector apparatus 10 is oriented in a north-south direction. For example, assuming arrow 24 represents geographic north then solar collector apparatus 10 is in position for collecting solar energy in a northern latitude. Conversely, if arrow 24 represents the direction for geographic south then solar collector apparatus 10 is oriented for collecting solar energy in a southern latitude.

Figure 2:
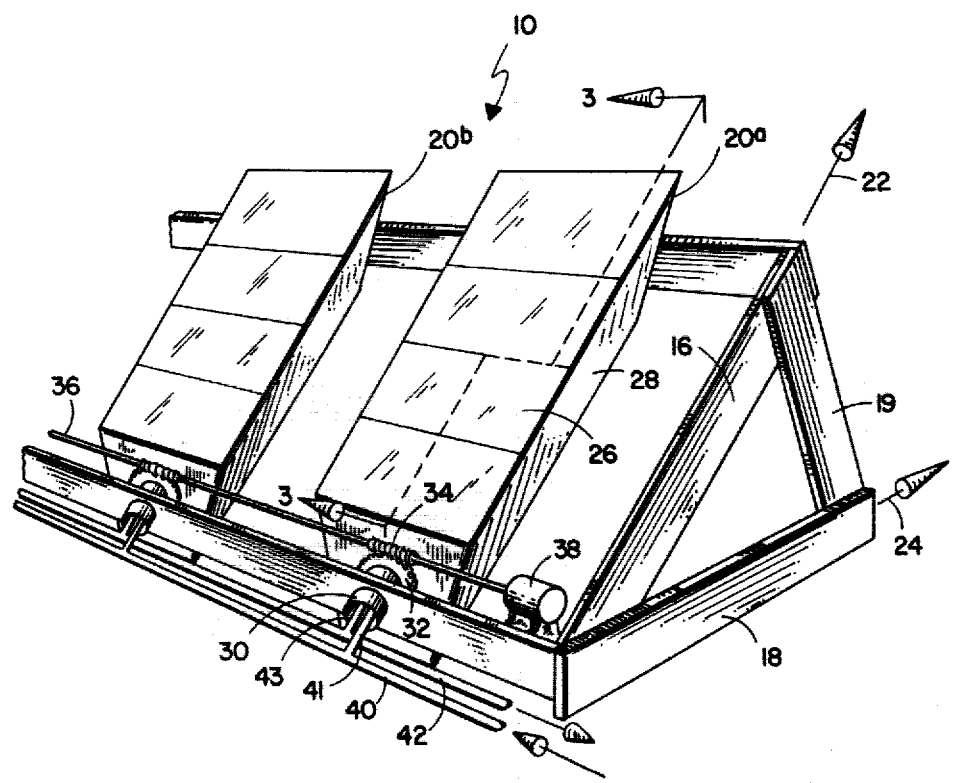
FIG. 2 is an enlarged perspective view of a fragment of a solar collector apparatus of FIG. 1.

Referring now more particularly to FIG. 2, a portion of solar collector apparatus 10 is shown and includes a plurality of solar collectors, shown herein as solar collectors 20a and 20b. Solar collectors 20a and 20b are supported in a framework 16 with framework 16 supported on a base 18 by a riser 19. Arrow 24 also indicates the direction north for the orientation of base 18 while framework 16 is supported by riser 19 in a direction indicated by arrow 22 representing a line parallel to the axis of rotation of the earth. In this manner, framework 16 serves as the basal framework for an equatorial mount for solar collectors 20a and 20b. The length of riser 19 is determined, therefore, by the latitude of placement of solar collector apparatus 10 and, if desired, may be configurated as an automatically adjustable lifting assembly for orienting, where necessary, the solar collectors 20a and 20b toward the sun.

Figure 3:
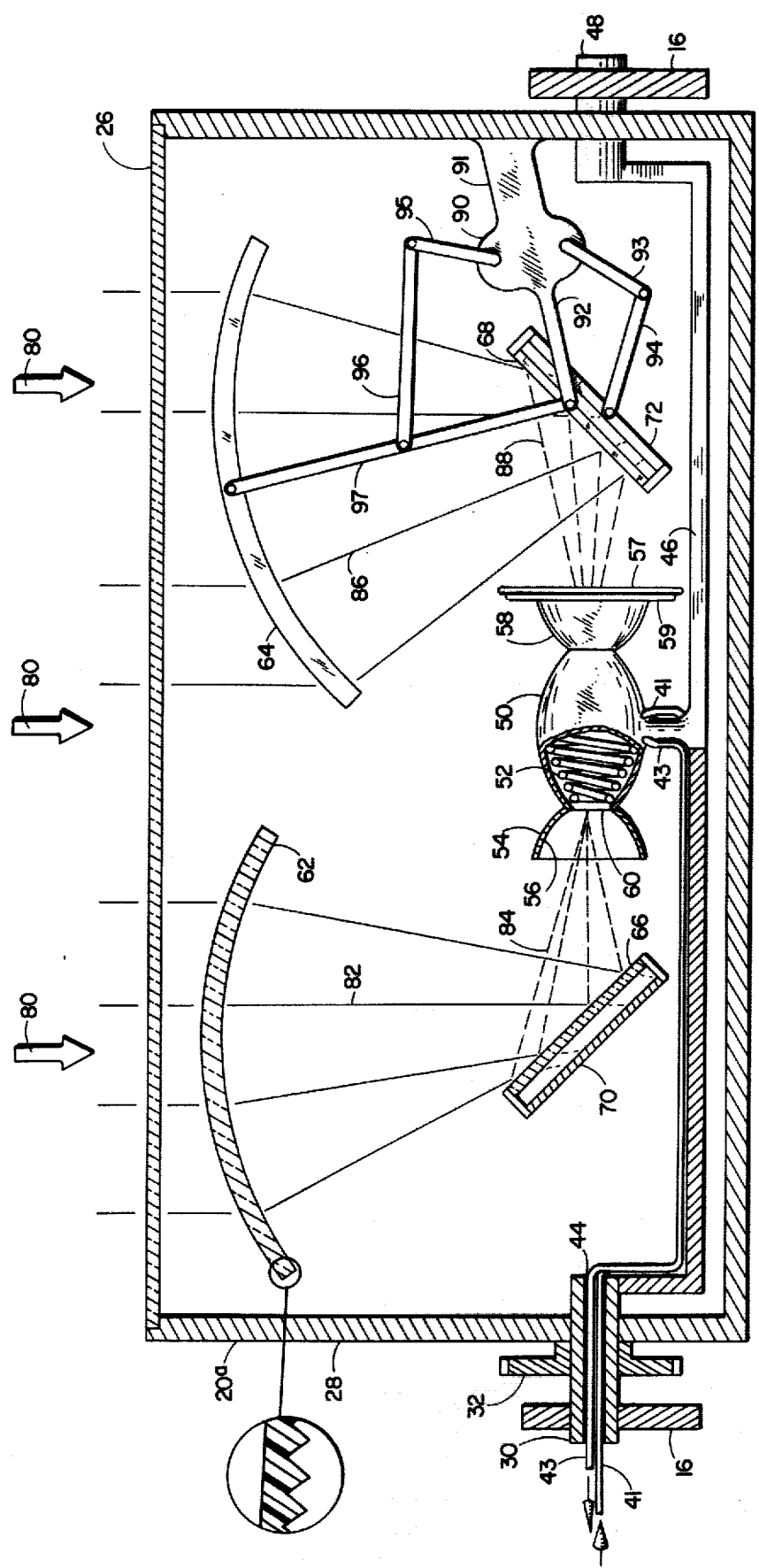
FIG. 3 is a cross section taken along lines 3—3 of FIG. 2.

Solar collector 20a is supported in framework 16 by a hollow axle 30 secured thereto. Hollow axle 30 remains stationary relative to framework 16 and solar collector 20a is rotatably mounted thereto. A gear 32 accommodates rotation of solar collector 20a about hollow axle 30 or, more particularly, the longitudinal axis represented by hollow axle 30 and axle 48 (FIG. 3). Gear 32 is engaged by a worm gear 34 mounted on a shaft 36. Shaft 36 is selectively turned by operation of a motor 38. Turning of shaft 36 by motor 38 causes worm gear 34 to advance or reverse gear 32 correspondingly to thereby rotate solar collector 20a about its longitudinal axis.

Heat transfer fluid is supplied and returned through header conduits 40 and 42, respectively, and distributed into each of the solar collectors 20a and 20b by the appropriate tubing such as tubing 41 and 43 to solar collector 20a. Since hollow axle 30 is nonrotatably mounted to framework 16, tubing conduits 41 and 43 pass in nonrotatable relationship through hollow axle 30 as will be set forth more fully hereinafter.

Referring now more particularly to FIG. 3, the structure of solar collector 20a is set forth in greater detail. Shell 28 and gear 32 rotate about hollow axle 30 to form a nonrotatable passageway through shell 28 and framework 16 for tubing conduits 41 and 43 to a solar energy absorber apparatus 50. In particular, tubing conduits 41 and 43 pass through a bore 44 of hollow axle 30 and are carried by a bridge 46 to solar energy absorber apparatus 50. The opposite end of bridge 46 terminates in axle 48 which is nonrotatably mounted in frame 16. Accordingly, shell 28 is rotatable about a longitudinal axis between hollow axle 30 and axle 48 to accommodate thereby the daily tracking of the sun in its apparent east-west movement.

The open top of shell 28 is covered by a transparent cover 26 to enclose the internal apparatus against inclement weather and heat losses to the ambient. The bottom of shell 28 could also include additional weight to serve as a counter balance to offset the rotational torque resulting from the offset configuration of shell 28 and the components therein relative to the longitudinal axis.

It shall be understood that the word shell shall include both enclosed or airtight structures (as shown in FIG. 2) as well as non enclosing or non airtight structures such as lattice or open framework structures (not shown). It shall be understood also that such open structure shells may be enclosed either singly or in gangs behind a transparent or greenhouse-like cover (not shown) to provide protection from weather.

Shell 28 also serves as a support for a plurality of focusing means inside solar collector 20a. In particular, Fresnel lenses 62 and 64 are supported therein and serve as the focusing apparatus for focusing solar flux 80 as focused solar flux 82 and 86, respectively. The focused solar flux 82 and 86 is reflected by mirrors 66 and 68, respectively, to form reflected solar flux 84 and 88, respectively. A portion of scattered solar flux inherently present inside shell 28 is further concentrated by optional parabolic reflectors known in the art as Winston collectors 54 and 58 and, more particularly, to the reflective, parabolic surface such as surface 56 of Winston collector 54. In this manner, the concentrated, focused solar flux and portions of the scattered flux which is scattered in a solid angle about the incident direct solar flux is received by solar energy absorber apparatus 50. The solar flux directed into solar energy absorber apparatus 50 is absorbed therein by the heat transfer fluid passing through coils 52 between tubing conduits 41 and 43.

An optional flat plate collector 57 is included as an annulus around optional Winston collector 58 to further absorb a portion of the scattered solar flux inside shell 28. Clearly collector 57 could be used with holorum 50 independently and without Winston Collector 58. Coils 59 are attached to the rear face of flat plate collector 57 and may serve as a preheater for incoming heat transfer fluid through tubing conduit 41. Alternatively, flat plate collector 57 can be configured as a photovoltaic apparatus for converting sunlight into electrical energy with coils 59 providing any required cooling.

Each of Fresnel lenses 62 and 64 is adapted to be moved internally within the confines of shell 28 to thereby focus or otherwise concentrate solar flux 80 on mirrors 66 and 68, respectively. Movement of Fresnel lenses 62 and 64 is required since framework 16 and, more particularly, the longitudinal axis of solar collector 20a is generally fixed in a position parallel to the axis of the earth as represented by arrow 22 (FIG. 2). Accordingly, as the sun moves through seasonal changes in its relative position with respect to the earth's latitude, Fresnel lenses 62 and 64 suitably track the sun in its seasonal variations to accommodate focusing the solar flux on the respective mirrors and as set forth hereinbefore. Mounting of Fresnel lens 64 is accomplished by means of a lever 97 which is pivotally mounted to mirror 68. Mirror 68 is supported by a brace 92 extending from a controller 90. Movement of lever 97 is accomplished through an extension 96 attached to the end of an arm 95. Movement of arm 95 is controlled by controller 90. Controller 90 is selectively controlled to provide the appropriate movement of Fresnel lens 64 for solar tracking as set forth hereinbefore.

Mirror 66 is also rotated in coordination with movement of Fresnel lens 64 so as to reflect the concentrated solar flux 88 into solar energy absorber apparatus 50. In the particular embodiment illustrated herein, mirror 68 requires an angular rotation of only one half that of Fresnel lens 64 to thereby accomplish the foregoing purposes. Rotation of mirror 68 is accomplished through an extension member 94 which is controlled by a moveable arm 93. Movable arm 93 is, in turn, also controlled by controller 90.

It should be noted that Fresnel lens 64 and mirror 68 along with controller 90 are mounted to shell 28 through a bracket 91 thereby permitting the foregoing structure to be rotated with shell 20a while solar energy absorber apparatus 50 is nonrotatably mounted therein to preclude any form of twisting or otherwise turning of tubing conduits 41 and 43.

While the apparatus of this invention is primarily directed toward collecting solar flux 80 and converting the same to thermal energy for heating the heat transfer fluid passing between tubing conduits 41 and 43, an optimum portion of the solar spectrum can be converted into electrical energy by means of photovoltaic converters 70 and 72 attached to the rear of mirrors 66 and 68, respectively. In this particular instance, each of mirror 66 and 68 is fabricated as a selectively reflective mirrored surface to permit a limited portion of the solar spectrum to pass therethrough and most efficiently activate the photovoltaic apparatus 70 and 72.

Furthermore, the holorum apparatus herein may be fabricated with a beam splitter-type device (not shown) having a selective surface thereon for reflecting a predetermined portion of the solar spectrum toward a first photovoltaic apparatus (not shown) having a higher efficiency with that particular spectral range and transmitting the remainder of the solar spectrum toward a second photovoltaic apparatus (not shown) having a higher efficiency with that particular spectral range. This is conventional apparatus and is, therefore, not specifically illustrated herein. The conduits would be suitably reconfigured to provide any required cooling for the subject photovoltaic apparatus.

Figure 4:
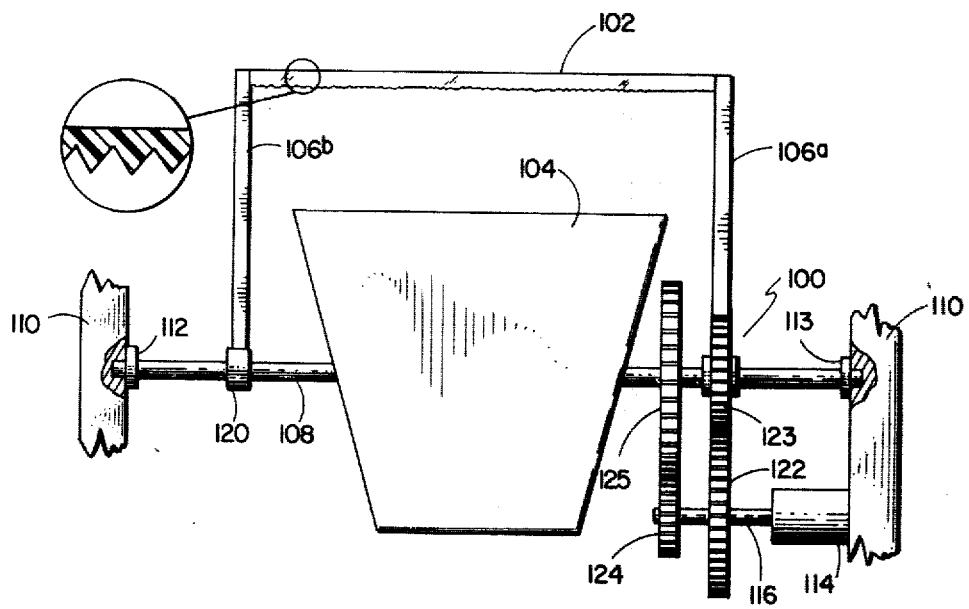
FIG. 4 is a front elevation of an alternate embodiment for supporting a mirror and lens assembly.

Referring now more particularly to FIG. 4, a second preferred embodiment for providing the relative movement of the Fresnel lens and mirror apparatus of this invention is shown herein. A Fresnel lens 102 is surmounted over a mirror 104 and is mounted on the ends of vertical support arms 106a and 106b. Support arm 106a terminates in a gear 123 while support arm 106b terminates in a bearing 120 on a shaft 108. Shaft 108 also serves as the support for mirror 104 and is rotatably engaged to outer walls 110 of the solar collector apparatus by bearings 112 and 113. Walls 110 corresponding to the side walls of shell 28 (FIGS. 2 and 3).

Gear 123 is rotatably mounted to shaft 108 by a bearing and is engaged by a second gear 122 fixed to a motor shaft 116. A second gear 124 is also fixed to motor shaft 116 so that motor 114 will turn shaft 116 causing each of gears 122 and 124 to be rotated. Gear 122 turns gear 123 causing support arm 106a and, correspondingly, Fresnel lens 102 to be moved in an arcuate manner about shaft 108. Correspondingly, turning of gear 124 causes gear 125 to turn and imparts a corresponding rotation to mirror 104 about shaft 108. It should be noted that the diameters of each of gears 122-125 is selectively predetermined to accomplish the appropriate movement of Fresnel lens 102 relative to mirror 104. For example, the diameters of gears 122 and 123 are equal whereas the diameter of gear 124 is one half of gear 125. In this manner, the angular rotation of mirror 104 about shaft 108 is one half that of Fresnel lens 102.

Figure 5:
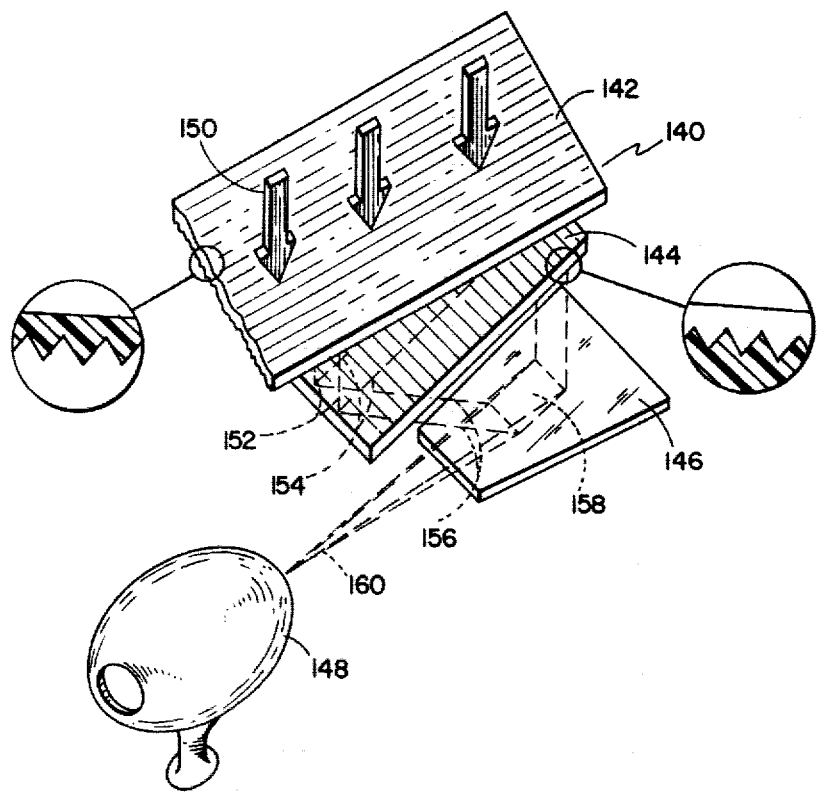
FIG. 5 is a fragmentary perspective view of an alternate focusing system utilizing a linear Fresnel lens and mirror system.

Referring now more particularly to FIG. 5, a third preferred embodiment of the focusing apparatus of this invention is shown herein and includes a first Fresnel lens 142, a second Fresnel lens 144, and a mirror 146. The first Fresnel lens 142 is configurated as a linear Fresnel lens with focusing lenslets formed therein as linear grooves parallel to the longitudinal axis of first Fresnel lens 142. Correspondingly, the second Fresnel lens 144 is configurated with transverse lenslets formed as transverse grooves at a position perpendicular to the orientation of the lenslets in first Fresnel lens 142. The longitudinal orientation of the lenslets of first Fresnel lens 142 focuses the solar flux as rays 152 in a generally longitudinal focal pattern 154 along the face of second Fresnel lens 144. The transverse or lateral lenslets of second Fresnel lens 144 further concentrate the solar flux as rays 156 into a generally rectangular focal pattern 158 on mirror 146. The focused solar flux is reflected as concentrated solar flux 160 into solar energy absorber apparatus 148. Any astigmatism resulting from Fresnel lenses 142 and 144 may be partially compensated by incorporating a Winston collector, such as Winston collectors 54 and 58 (FIG. 3), around the opening in each end of solar energy absorber apparatus 148.

The particular configuration of focusing apparatus 140 may be selectively placed in solar collector 20a (FIGS. 2 and 3) by replacing clear cover 26 with first Fresnel lens 42 and mounting second Fresnel lens 144 in place of the curvilinear Fresnel lens 62 or 64. Mirror 146 is comparable to mirrors 66 and 68. It should be understood further that holorum 50 in FIG. 3 or holorum 148 in FIG. 5 may be replaced by fluid cooled photovoltaic cells. Selective mirrors 66, 68, 104, or 146 and two or more types of photovoltaic cells, one type mounted behind the mirrors as shown and one type or more replacing the holorum, may be used to provide an optimum efficiency system for production of electric power from concentrated sunlight. Concentrated solar flux reduces the area of solar cells required for electric power production and thus minimizes the cost of this expensive item. It is known in the art that the use of two or more different types of photo cells (for example galium, arsenide and silicon) matched to their optimum spectral ranges, gives an overall system performance about double the efficiency of either cell used exclusively. Fluid cooling further increases the efficiency of the photovoltaic cells. The heated fluid may be used for space heating or air conditioning.

The invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes that come within the meaning and range of equivalency of the claims are to be embraced within their scope.

What is claimed and desired to be secured by a United States Letters Patent is:

1. A solar collector comprising:
    a shell structure, the shell structure having an open top;
    first mounting means for the shell structure for rotating the shell structure about an axis to orient the open top of the shell structure toward the sun;
    solar energy absorber means inside the shell structure and mounted coaxially with the axis;
    second mounting means for supporting the solar energy absorber means inside the shell structure in a nonrotatable position relative to the sun to thereby accomodate rotational movement of the shell structure about the solar energy absorber means, the second mounting means comprising a first hollow shaft and a second shaft, the shell structure being rotatably mounted on the first hollow shaft and the second shaft, the second mounting means further comprising a bridge structure extending between the first hollow shaft and the second shaft, the bridge structure supporting the solar energy absorber means; and
    focusing means in the shell structure for focusing solar energy toward the solar energy absorber means and focusing the solar energy coaxially on the solar energy absorber means, said focusing means comprising a Fresnel lens means inside the shell structure and mounted to focus solar energy on a mirror means, the mirror means reflecting the solar energy toward the solar energy absorber means.

2. The solar collector defined in claim 1 wherein the first mounting means comprises a framework with the shell structure rotatably mounted to the framework.

3. The solar collector defined in claim 2 wherein the framework further comprises means for orienting the framework in an orientation to place the axis of the shell structure generally parallel to the axis of rotation of the earth.

4. The solar collector defined in claim 2 wherein the first mounting means further comprises a base for supporting the framework, the base being oriented in a north-south direction to accommodate orienting the open top of the shell structure toward the sun.

5. The solar collector defined in claim 1 wherein the shell structure further comprises a transparent cover over the open top of the shell structure.

6. The solar collector defined in claim 1 wherein the second mounting means comprises a first hollow shaft on at least one end of the shell structure, the hollow shaft serving as a passageway for said conduit means in rotatable relation to the shell structure and nonrotatable relation to said framework.

7. The solar collector defined in claim 1 wherein the solar energy absorber means includes photovoltaic means for converting solar energy to electrical energy.

8. The solar collector defined in claim 1 wherein the solar energy absorber means includes conduit means for conducting a fluid heat transfer medium to and from the solar energy absorber means, the conduit means passing through the hollow axle of the second mounting means thereby avoiding rotation of the conduit means when the shell structure is rotated upon the first mounting means.

9. The solar collector defined in claim 1 wherein the solar energy absorber means comprises a holorum.

10. A solar collector comprising:
a shell structure, the shell structure having an open top;
first mounting means for the shell structure for rotating the shell structure about an axis to orient the open top of the shell structure toward the sun;
solar energy absorber means inside the shell structure;
second mounting means for supporting the solar energy absorber means inside the shell structure in a nonrotatable position relative to the sun to thereby accommodate rotational movement of the shell structure about the solar energy absorber means, the second mounting means including a hollow axle; and
focusing means in the shell structure for focusing solar energy toward the solar energy absorber means, the focusing means comprising a Fresnel lens means and a mirror, the Fresnel lens means focusing solar flux on the mirror and the mirror reflecting the focused solar flux toward the solar energy absorber means, the Fresnel lens means further comprising support means for moveably supporting the Fresnel lens means inside said shell structure to accommodate movement of the Fresnel lens means in tracking relationship to the sun, the support structure further comprising support means for supporting said mirror relative to said Fresnel lens means to accommodate reflecting solar energy to said solar energy absorber means.

11. The solar collector defined in claim 10 wherein the support means comprises a first support arm adapted to pivotally support a mirror at the longitudinal axis of the second mounting means, a second support arm to support a Fresnel lens means over the mirror and linkage to move the angular orientation of the mirror to about one half the angular movement of the Fresnel lens.

12. The solar collector defined in claim 10 wherein the support means comprises a rotatable shaft, a mirror mounted to the shaft, a Fresnel lens rotatably mounted to the shaft on extended arms and gear means for rotating the Fresnel lens about the shaft while changing the angular rotation of the mirror to about one half the angular displacement of the Fresnel lens.

13. A solar collector apparatus comprising:
a framework;
a plurality of solar collectors;
first mounting means for rotatably mounting the solar collectors in the framework, each solar collector being rotatable about an axis;
solar energy absorber means in each of the solar collectors and mounted coaxially with the axis of the solar collector;
second mounting means for mounting the solar energy absorber means in each of the solar collectors and nonrotatably relative to the framework, the second mounting means comprising at least one hollow axle for each solar collector;
conduit means for transporting a fluid heat transfer medium through the solar energy absorber means, the second mounting means further comprising a bridge structure in each solar collector, the bridge structure being nonrotatably mounted to the framework and serving as a platform for the solar energy absorber means and the conduit means;
the conduit means passing through the hollow axle of the second mounting means and thereby being in nonrotatable relationship with said framework; and
focusing means in each solar collector for focusing solar energy coaxially toward each solar energy absorber means, said focusing means comprising a Fresnel lens means and a mirror means, the Fresnel lens means focusing solar energy on the mirror means and the mirror means reflecting the solar energy coaxially toward the solar energy absorber means.

14. The solar collector apparatus defined in claim 13 wherein the first mounting means further comprises rotating means for rotating the solar collectors in the framework.

15. The solar collector apparatus defined in claim 14 wherein the rotating means comprises a gear on each solar collector and a rotatable shaft with a plurality of worm gears on the shaft, each of the worm gears selectively engaging the gears on the solar collector so that rotation of the shaft imparts rotation to the solar collectors.

16. The solar collector apparatus defined in claim 13 wherein the Fresnel lens means is configurated as a curvilinear Fresnel lens and the mirror is configurated as a flat mirror.

17. The solar collector apparatus defined in claim 13 wherein the Fresnel lens means is configurated as a first Fresnel lens and a second Fresnel lens, the first Fresnel lens configured as a linear Fresnel lens and serving as a cover for said solar collector and having a linear focus, the second Fresnel lens configurated as a second, linear Fresnel lens having a linear focus transverse to the first Fresnel lens, the first Fresnel lens focusing solar flux as a generally linear focal pattern on said second Fresnel lens, said second Fresnel lens focusing the solar flux in a generally rectangular focal pattern on said mirror.

18. A solar collector apparatus comprising:
a framework;
a plurality of solar collectors;
first mounting means for rotatably mounting the solar collectors in the framework;
solar energy absorber means in each of the solar collectors;
second mounting means for mounting the solar energy absorber means in each of the solar collectors and nonrotatably relative to the framework, the second mounting means comprising at least one hollow axle for each solar collector;
conduit means for transporting a fluid heat transfer medium through the solar energy absorber means, the conduit means passing through the hollow axle of the second mounting means and thereby being in nonrotatable relationship with said framework; and
focusing means in each solar collector for focusing solar energy toward each solar energy absorber means, said focusing means comprising a Fresnel lens means and a mirror means, the Fresnel lens means focusing solar energy on the mirror means and the mirror means reflecting the solar energy coaxially toward the solar energy absorber means, said focusing means further comprising support means for supporting at least one Fresnel lens means inside said shell structure in spaced relationship to a mirror means, said support means orienting said Fresnel lens means for tracking the sun while said mirror is oriented relative to said Fresnel lens means for reflecting said focused solar flux toward said solar energy absorber means.

* * * * *